US006425669B1

(12) United States Patent
Mei et al.

(10) Patent No.: US 6,425,669 B1
(45) Date of Patent: Jul. 30, 2002

(54) MASKLESS EXPOSURE SYSTEM

(75) Inventors: Wenhui Mei, Plano; Takashi Kanatake, Dallas, both of TX (US); Karlton Powell, Lake Stevens, WA (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/577,453

(22) Filed: May 24, 2000

(51) Int. Cl.$^7$ .............................................. G03B 21/14
(52) U.S. Cl. ..................... 353/122; 353/30; 347/239; 347/241; 349/2
(58) Field of Search ........................... 353/46, 38, 122, 353/94, 8, 30, 20; 349/2; 355/50, 51, 53, 75, 77; 348/742, 743, 771; 347/238, 241, 242, 243, 256, 257, 258, 259

(56) References Cited

U.S. PATENT DOCUMENTS

| 3,534,467 A | 10/1970 | Sach et al. ..................... 29/583 |
| 4,126,812 A | 11/1978 | Wakefield .................... 313/500 |
| 4,744,047 A | 5/1988 | Okamoto et al. ........... 364/900 |

(List continued on next page.)

FOREIGN PATENT DOCUMENTS

| EP | 0 552 953 A1 | 7/1993 |
| WO | WO 91/10170 | 7/1991 |

OTHER PUBLICATIONS

"New Multi–EB Direct Write Concept for Maskless High Throughput", Canon SubMicron Focus, vol. 5, Summer 2000.

Sandstrom and Odselius, "Large–Area High Quality Photo-masks", Micronic Laser Systems, published by SPIE vol. 2621, pp. 312–318.
Exhibit A of USP 5,691,541 issued Nov. 25, 1997.
Application No. 09/094,761, filed Jun. 15, 1998, entitled: Total Internal Reflection Holography Method and Apparatus for Lithography on a 3–D Spherical Shaped Integrated Circuit, by Karlton Powell, copy of first page of specification, abstract and figure No. 1 (Attorney Docket No. 22397.64).
Application No. 09/107,875, filed Jun. 30, 1998, entitled: Spherical Cell Design for VLSI Circuit Design on a Spherical Semiconductor, by Eiji Matsunaga and Nobuo Takeda, copy of first page of specification, abstract and figure No. 1 (Attorney Docket No. 22397.67).
Application No. 09/348,369, filed Jul. 7, 1999, entitled: Maskless Photolithography System by Wenhui Mei, Takashi Kanatake and Akira Ishikawa, copy of first page of specification, abstract and figur No. 1 (Attornet Docket No. 22397.84.02).
Singh–Gasson, Sangeet et al., Maskless Fabrication of Light–Directed Oligonucleotide Microarrays Using a Digital Micromirror Array, vol. 17, No. 10, Oct. 1999, pp. 974–978.
Devitt, Terry, Advanced May Put Gene Chip Technology on Scientists Desktops, http://www.biotech.wise.edu/Education/biotechnews/GeneChip.html, Oct. 7, 1999.

Primary Examiner—William Dowling
(74) Attorney, Agent, or Firm—Haynes & Boone, LLP

(57) ABSTRACT

A photolithography system and method for providing a pattern to a subject such as a wafer is provided. The system includes a pixel panel, such as a digital mirror device or a liquid crystal display, for generating for creating a plurality of pixel elements of the pattern. The pixel elements are simultaneously directed to a first site of the subject by a lense system. The system also includes a manipulator for moving the pixel elements, relative to the subject, to a second site of the subject so that a portion of the second site overlaps a portion of the first site.

25 Claims, 5 Drawing Sheets

U.S. PATENT DOCUMENTS

| | | | |
|---|---|---|---|
| 4,879,466 A | 11/1989 | Kitaguchi et al. | 250/370.14 |
| 5,082,755 A | 1/1992 | Liu | 430/5 |
| 5,109,290 A * | 4/1992 | Imai | 359/54 |
| 5,121,983 A * | 6/1992 | Lee | 353/8 |
| 5,131,976 A | 7/1992 | Hoko | 156/630 |
| 5,138,368 A | 8/1992 | Kahn et al. | 355/53 |
| 5,195,103 A | 3/1993 | Hinton et al. | |
| 5,250,967 A * | 10/1993 | Miyashita | 353/38 |
| 5,269,882 A | 12/1993 | Jacobsen | 156/659.1 |
| 5,281,996 A | 1/1994 | Bruning et al. | 355/77 |
| 5,300,966 A * | 4/1994 | Uehira et al. | 353/30 |
| 5,361,272 A | 11/1994 | Gorelik | 372/50 |
| 5,416,729 A | 5/1995 | Leon et al. | 364/578 |
| 5,431,127 A | 7/1995 | Stevens et al. | 117/75 |
| 5,461,455 A | 10/1995 | Coteus et al. | 355/43 |
| 5,691,541 A | 11/1997 | Ceglio et al. | 250/492.1 |
| 5,870,176 A | 2/1999 | Sweatt et al. | 355/53 |
| 5,900,637 A | 5/1999 | Smith | 250/492.22 |
| 5,905,545 A * | 5/1999 | Poradish et al. | 348/743 |
| 5,909,658 A | 6/1999 | Clarke et al. | 702/126 |
| 5,955,776 A | 9/1999 | Ishikawa | 257/618 |
| 5,971,546 A * | 10/1999 | Park | 353/38 |
| 5,995,129 A * | 11/1999 | Sunagawa et al. | 349/2 |
| 5,998,069 A | 12/1999 | Cutter et al. | 430/5 |
| 6,084,656 A | 7/2000 | Choi et al. | 355/71 |
| 6,124,876 A * | 9/2000 | Sunagawa | 349/2 |
| 6,133,986 A | 10/2000 | Johnson | 355/67 |

* cited by examiner

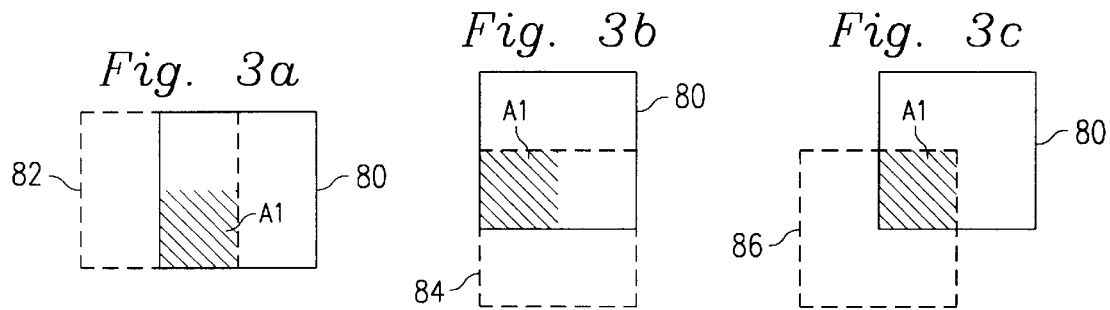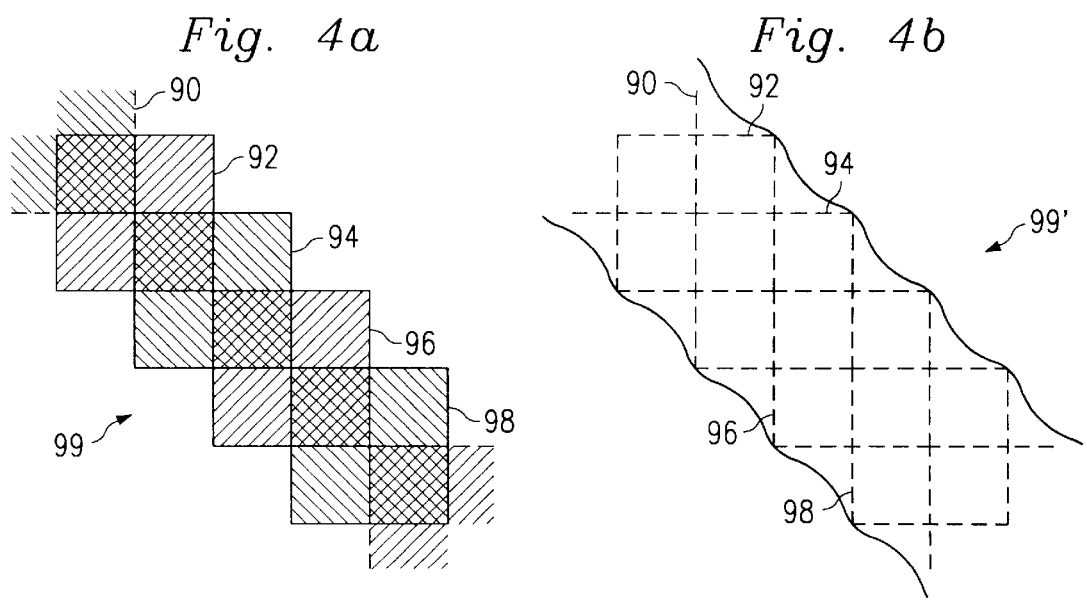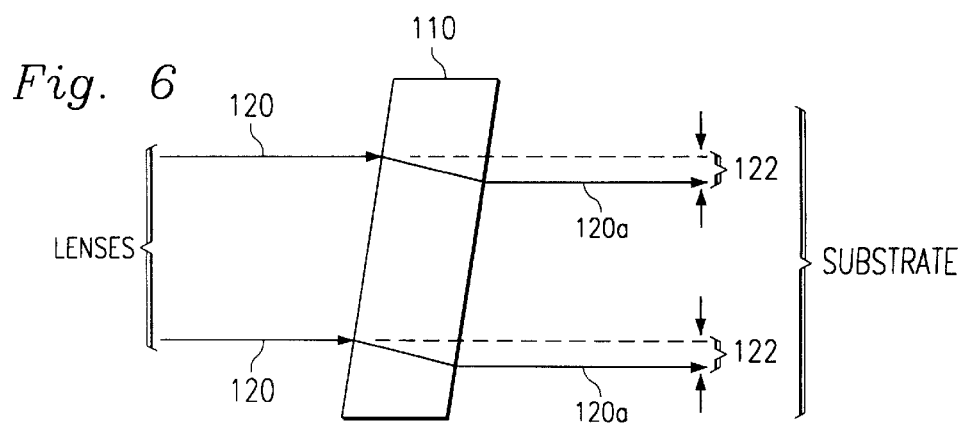

MASKLESS EXPOSURE SYSTEM

BACKGROUND

The present invention relates generally to photographic exposure equipment, and more particularly, to a photolithography system and method, such as can be used in the manufacture of semiconductor integrated circuit devices.

In conventional photolithography systems, the photographic equipment requires a mask for printing a pattern onto a photo resist coated subject. The subject may include, for example, a semiconductor substrate for manufacture of integrated circuits, metal substrate for etched lead frame manufacture, conductive plate for printed circuit board manufacture, or the like. A patterned mask or photomask may include, for example, a plurality of lines, structures, or images. During a photolithographic exposure, the photo resist coated subject must be aligned to the mask very accurately using some form of mechanical control and sophisticated alignment mechanism.

U.S. patent Ser. No. 09/480,796, filed Jan. 10, 2000 and hereby incorporated by reference, discloses a novel system and method for photolithography which provides a moving pixel image onto specific sites on a subject. A "site" may represent a single pixel, or a group of pixels, depending on the embodiment. In one embodiment, the method projects a pixel-mask pattern onto a subject such as a wafer. The method provides a sub-pattern to a pixel panel pattern generator such as a deformable mirror device or a liquid crystal display. The pixel panel provides a plurality of pixel elements corresponding to the sub-pattern that may be projected onto the subject.

Each of the plurality of pixel elements is then simultaneously focused to discrete, non-contiguous portions of the subject. The subject and pixel elements are then moved (e.g., by vibrating one or both of the subject and pixel elements) and the sub-pattern is changed responsive to the movement and responsive to the pixel-mask pattern. As a result, light can be projected into the sub-pattern to create the plurality of pixel elements on the subject, and the pixel elements can be moved and altered, according to the pixel-mask pattern, to create a contiguous image on the subject.

Certain improvements are desired for maskless photolithograph systems in general, such as the above-described system and method. These improvements increase exposure area, increase exposure intensity, and/or handle errors in the pixel panel.

SUMMARY

A technical advance is achieved by a novel system and method for photolithography which provides a digital image from a pixel panel onto one or more specific sites on a subject. In one embodiment, the system includes a panel for generating the pattern and for creating a plurality of pixel elements. The pixel elements are simultaneously directed to a first site of the subject by one or more lenses. The system also includes a manipulator for moving the pixel elements, relative to the subject, to a second site of the subject so that a portion of the second site overlaps a portion of the first site. In some embodiments, the first and second sites are pixel-sites created by a single pixel of the panel.

In some embodiments, the panel is a micro mirror array for selectively reflecting light on and off to create the respective pixel elements. In other embodiments, the panel is a liquid crystal display for selectively allowing light to pass, thereby creating an on/off effect with the respective pixel elements.

In some embodiments, the manipulator further moves the pixel elements, relative to the subject, to a third site of the subject, so that a portion of the third site overlaps a portion of the first site. In some of these embodiments, the portion of the first site overlapped by the second site is the same as the portion of the first site overlapped by the third site.

In some embodiments, the manipulator is a mechanical device for physically moving the panel, relative to the subject. In some embodiments, the manipulator is a rotating prism with a first portion for moving a light path for the pixel elements to a first offset, and a second portion for moving the light path for the pixel elements to a second offset.

In some embodiments, the manipulator is an optical device for optically moving a light path for the pixel elements, relative to the subject. The manipulator may be a rotating optical device for selectively moving a light path for the pixel elements, relative to the subject. Alternatively or in addition, the manipulator may include multiple optical devices for moving a light path for the pixel elements in two dimensions, relative to the subject.

In some embodiments, the panel includes a first and second portion, each for creating corresponding portions of the plurality of pixel elements. In these embodiments, the system also includes an optical element, such as a beam splitter, for combining the pixel elements from the first portion of the panel with the pixel elements from the second portion of the panel so that both portions of pixel elements are directed to the substrate. In some embodiments, the first and second portions of pixel elements are adjacently provided to the substrate. Alternatively or in addition, the first and second portions of pixel elements may overlap each other.

In another embodiment, the system includes first and second panels for creating a first and second plurality of pixel elements, respectively. An optical element combines the first and second elements so that they are simultaneously projected onto a first site of the subject.

As a result, certain improvements are obtained. For one, errors or faulty pixels in the pixel panel are compensated. Also, in some embodiments the exposure area is increased, while in other embodiments the exposure intensity is increased. Furthermore, diagonal projections are better accommodated. Additional benefits can be readily seen from the attached drawings and the foregoing description.

BRIEF DESCRIPTION OF THE DRAWINGS

FIGS. 3a–3c illustrate various overlapping configurations of sites.

FIGS. 4a–4b illustrate various overlapping configurations of sites for creating a diagonal circuit element.

FIG. 6 is a cross sectional view of a prism of the system of FIG. 5.

DETAILED DESCRIPTION

The present disclosure relates to exposure systems, such as can be used in semiconductor photolithographic processing. It is understood, however, that the following disclosure provides many different embodiments, or examples, for implementing different features of one or more inventions. Specific examples of components and arrangements are described below to simplify the present disclosure. These are, of course, merely examples and are not intended to limit the invention from that described in the claims.

Figure 1:
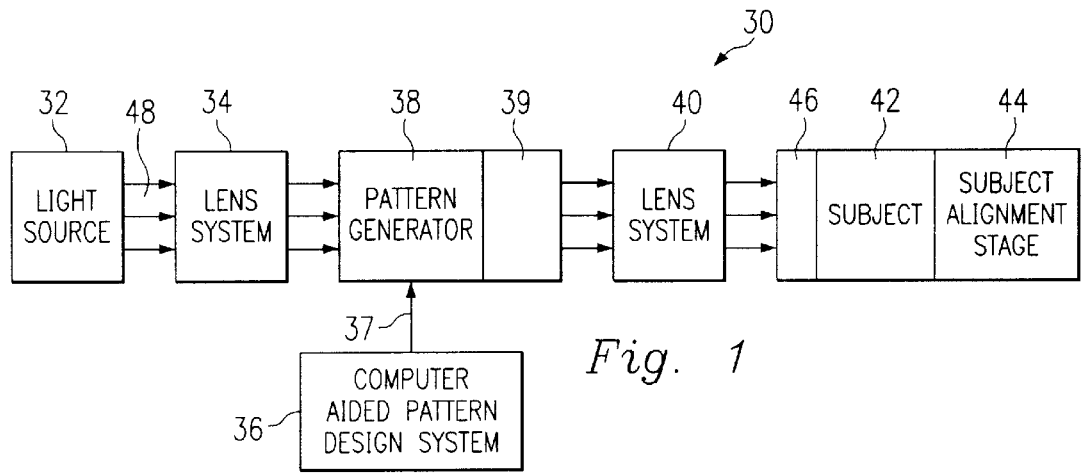
FIG. 1 illustrates a photolithography system according to presently incorporated U.S. patent Ser. No. 09/480,796.

With reference now to FIG. 1, a maskless photolithography system 30, as described in presently incorporated U.S. patent Ser. No. 09/480,796, includes a light source 32, a first lenses system 34, a computer aided pattern design system 36, a pixel panel 38, a panel alignment stage 39, a second lenses system 40, a subject 42, and a subject stage 44. A resist layer or coating 46 may be disposed on the subject 42. The light source 32 provides a collimated beam of light 48 which is projected upon the first lenses system 34 and onto the pixel panel 38. The pixel panel 38 is provided with digital data via suitable signal line(s) 37 from the computer aided pattern design system 36 to create a desired pixel pattern (the pixel-mask pattern). The pixel-mask pattern may be available and resident at the pixel panel 38 for a desired, specific duration. Light emanating from (or through) the pixel-mask pattern of the pixel panel 38 then passes through the second lenses system 40 and onto the subject 42. In this manner, the pixel-mask pattern is projected onto the resist coating 46 of the subject 42. Any modifications and/or changes required in the pixel-mask pattern can be made using the computer aided pattern design system 36. As a result, the need for fabrication of a new patterned printed mask, as would be required in conventional photolithography systems, is eliminated by the photolithography system 30 of the present disclosure.

Figure 2:
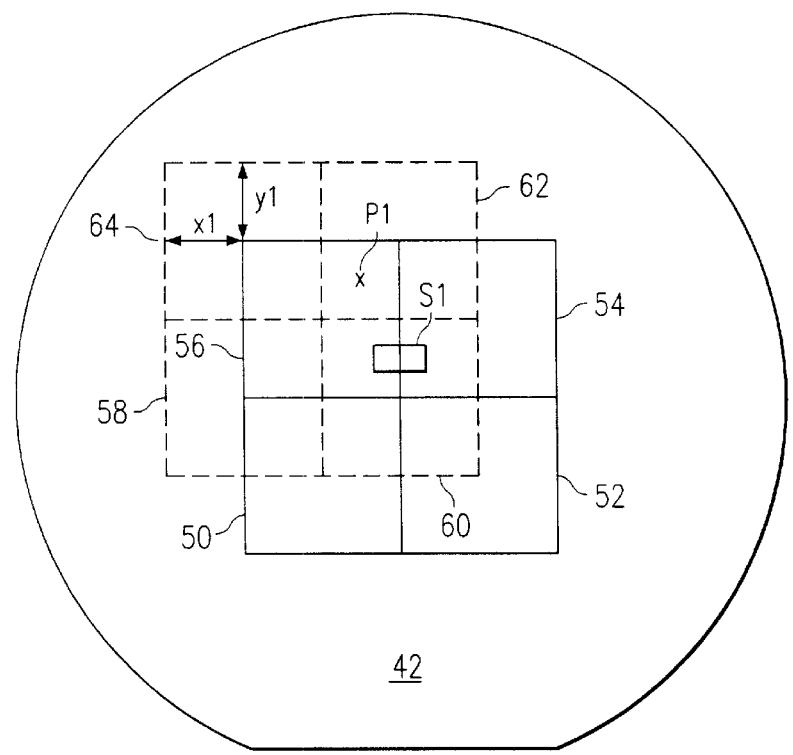
FIG. 2 illustrates a wafer and a plurality of sites exposed thereon.

Referring now to FIG. 2, the subject 42 may be a wafer, such as is used in conventional fabrication of semiconductor integrated circuits. It is understood, however, that many different substrates can benefit from the present invention, including for further example, a spherical shaped substrate. It is desired to project a plurality of images on the wafer 42 using the maskless photolithography system 30 of FIG. 1. It is understood that the illustration of FIG. 2 is not to scale, and the images are positioned and sized, and the number of images are reduced, to better clarify the present discussion.

In the present embodiments, the photolithography system 30 is drawing a plurality of images at sites 50, 52, 54, 56, 58, 60, 62, and 64. The image sites 50–64 may be similar in some respects to the sites 90a, 90b, 90c, and 90d, as shown in FIG. 6 of presently incorporated U.S. patent Ser. No. 09/480,796. In another implementation, the image sites 50–64 may be similar in some respects to micro-sites 90.1a, 90.2a, 90.3a and 90.4a, also shown in FIG. 6 of U.S. patent Ser. No. 09/480,796. Still other types of sites are contemplated. It is understood that the implementation of micro-sites in general is not a necessity for the present disclosure, but can be used in some embodiments. Other implementations, such as those discussed in U.S. Pat. No. 5,691,541, may also benefit from the present invention.

Continuing with the present embodiments, the image sites 50–56 are all adjacent to each other, and the image sites 58–64 are all adjacent to each other. However, various ones of the sites 50–64 overlap at certain portions. The overlapping is performed by offsetting the sites 58–64 by an increment less than the size of one image site. For example, the site 64 is offset from the site 56 by the value (x1, y1), where x1 is half the width of the site 56, and y1 is half the height of the site 56, as shown on the attached FIG. 1. By overlapping, errors in the pixel panel 38 can be accommodated.

In the embodiment of FIG. 2, the photolithography system 30 projects twice onto every portion of the wafer 42 (excluding, in some embodiments, the most peripheral portions of the wafer). For example, a portion P1 is covered by the image site 56 and the image site 62. Therefore, if one of the pixels of the pixel panel 38 is not working, the portion P1 is still covered by one of the sites. However, in this scenario the portion P1 is only exposed with half the intensity of other portions covered by two sites.

In addition, the intersection between two adjacent sites is facilitated by the overlapping site. For example, a line segment S1 may be drawn to span the sites 54 and 56. Since the line segment S1 is contiguous, it is important that the adjacent sites 54, 56 intersect with precision. With conventional systems, such precision may not always be achievable, and a small gap may appear in the segment S1 at the point of intersection between the two sites.

To accommodate for the gap and any other problems or inconsistencies, the site 60 also includes the segment S1. Since the portion of segment S1 at the intersection between the two sites 54, 56 is completely inside the site 60 (the segment S1 may actually be very long, and cover more sites), the overlapping of the site 60 fills in any gaps and alleviates many problems or inconsistencies that may occur.

Referring now to FIGS. 3a, 3b, and 3c, in another embodiment, a site 80 may be overlapped several times. For example, an area A1 of site 80 may be overlapped once by a site 82, a second time by a site 84, and a third time by a site 86. As a result, this extra redundancy allows for more faulty pixels and/or resolves more problems and inconsistencies. In addition, if only one of the pixels is not working, the intensity of the corresponding portion of the site 80 is reduced by only a fourth (instead of a half, as discussed with reference to FIG. 2).

Overlapping can be performed by physically moving one or both of the subject 42 or the pixel panel 38. Alternatively or in addition, the overlapping can be facilitated by moving the pixel pattern in the pixel panel 38 by the computer aided pattern design system 36. It is understood that the relative movement and hence the overlapping between the image and the subject can be performed in various manners. Furthermore, the relative movement can be a part of a normal line-scanning or image-scanning lithographic operation.

Referring to FIG. 4a, in addition, the overlapped sites better support non-linear structures. For example, the sites 90–98 are diagonally situated to create a diagonal circuit structure such as a metal line or a poly region. The sites 90–98 may also represent subsets of one or more pixels from the pixel panel 38. A diagonal line 99 is thereby created.

Referring also to FIG. 4b, when the diagonal line 99 is developed, a slight "blurring" occurs at the corners of the sites 90–98. This blurring helps to better create a developed diagonal line, now designated with the numeral 99'.

In some embodiments, the diagonally situated sites 90–98 may be exposed at a different intensity to the sites that are horizontal or vertical in nature. For example, a line may be created with a series of fully exposed horizontal sites. When the line moves in a diagonal direction, the corresponding sites can be partially exposed (e.g., at 50%). The overlapping of the diagonal sites causes only a portion of the sites to be more fully exposed (e.g., 50% times two). As a result, the diagonal line 99' is better shaped after the blurring, than if all the diagonal sites 90–98 are fully exposed.

Figure 5:
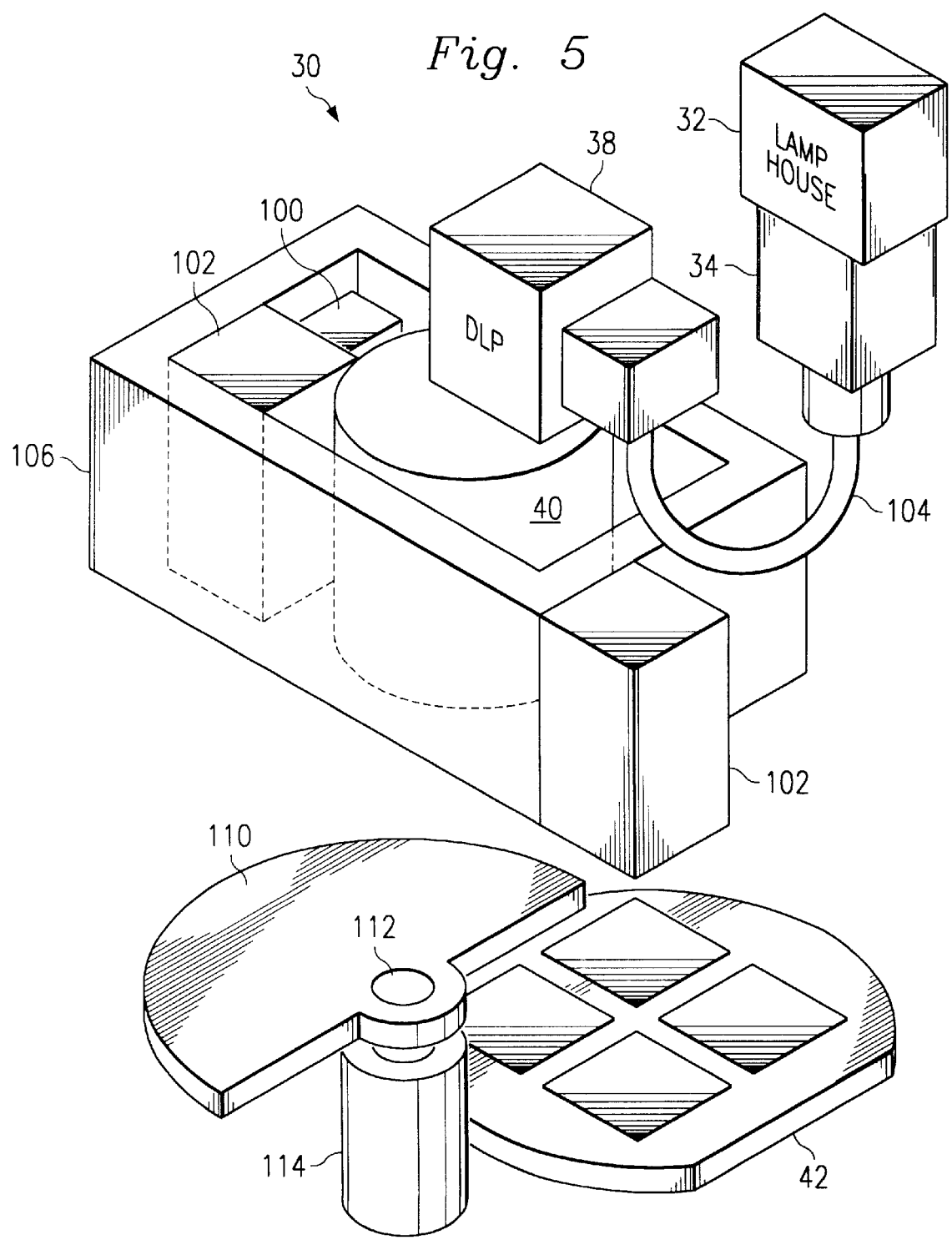
FIG. 5 is a side view of a photolithography system for implementing one or more embodiments of the present invention.

Referring now to FIG. 5, one embodiment of the maskless photolithography system 30 is shown with more mechanical detail. In this embodiment, the light source 32 (which may have one or more lenses 34 included therewith) projects light onto the pixel panel 38. The pixel panel 38 and the lense system 40 are mounted together on a moving structure 100. The moving structure 100 is also connected to a stage mover 102 for moving the structure, and thus all the components mounted to the structure, according to the desired overlapping process. It is noted that the light source 32 is connected to the pixel panel 38 through a flexible light conductor 104. In an alternate embodiment, the light source 32 may be affixed to the moving structure 100. The moving structure 100 is further connected to a stationary structure 106 for securing and facilitating the movement of the system 30 in a controlled manner.

The light from the source 32 reflects off the pixel panel 38 (according to the pixel pattern), through the lense system 40 and onto the wafer 42, thus exposing one or more sites. The stage mover 102 moves the moving structure 100, and thus the pixel panel 38 and the lense system 40, to expose the offset sites.

In one embodiment, a parallel prism 110 is positioned in the light path between the pixel panel 38 and the wafer 42. In one embodiment, the parallel prism 110 is a half disc. The prism 110 also includes a pivot point 112 that is connected to a rotating motor 114. The motor 114 rotates the prism 110 so that the prism is in the light path half of the time, and is outside of the light path the other half of the time. In other embodiments, the parallel prism 110 may have several portions of different thicknesses, thereby producing varying degrees of offset. In still other embodiments, multiple parallel prisms may be used to provide offsets in multiple directions, or to combine to provide offsets in even more directions, such as is described in FIGS. 3a–3c.

By using the prism(s) 110, the amount of movement of the subject 42 and/or the moving structure 100 is reduced. This not only reduces mechanical errors, but also provides a better site location.

Referring also to FIG. 6, the light path is illustrated by light waves 120. As the light 120 passes through the prism 110, it is refracted so that as it leaves the prism, it is offset by a predetermined amount. For the sake of reference, the offset light waves are designated with the numeral 120a and the amount of the offset is designated by the numeral 122. It is understood that properties of the prism 110 can be chosen to produce the desire offset.

In some embodiments, it may be desired to either increase the size of the site being exposed, or to increase the resolution of the site (or both). If the pixel panel 38 is a digital light processor (DLP) or digital mirror device (DMD) such as is illustrated in U.S. Pat. No. 5,079,544 and patents referenced therein, current technology provides a 600×800 array of mirrors. Therefore, for a resolution limit of 1 micron, each site will be about 0.6 mm×0.8 mm. However, the 1 micron resolution limit cannot be provided for diagonal lines. Therefore, an even smaller site (or a larger resolution limit) is required.

Because the resolution limit is often very important, it is sometimes desirable to combine several pixel panels for a single exposure. However, it is difficult to combine pixel panels in a production-worthy manner. For one reason, the edges of the pixel panels cannot abut to each other. That is, there will always be some amount of space between two adjacent pixel panels.

Figure 7:
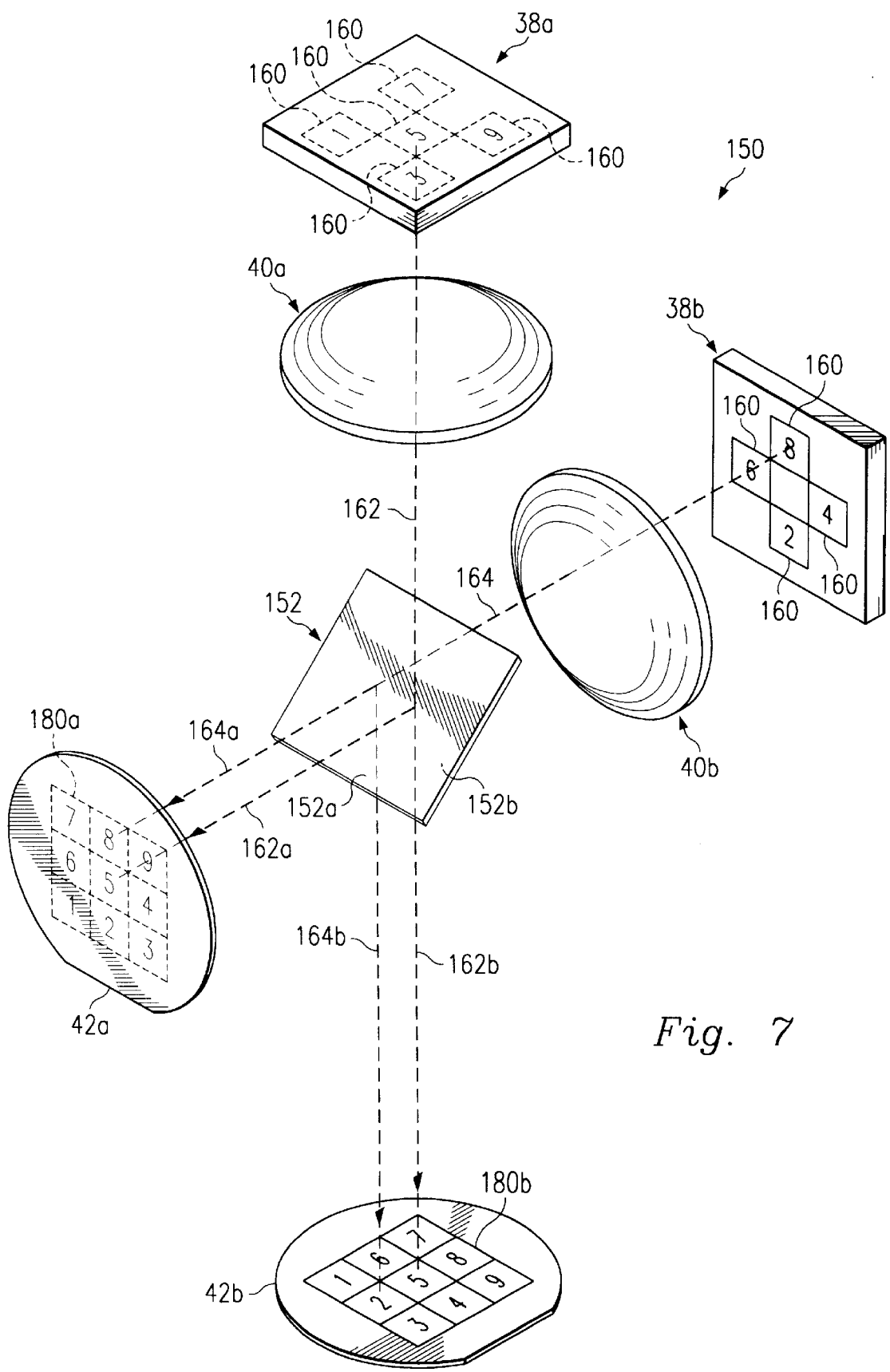
FIG. 7 is a side view of a photolithography system for implementing other embodiments of the present invention.

Referring now to FIG. 7, another embodiment of a maskless photolithography system is designated with the reference numeral 150. The system 150 includes two pixel panels 38a, 38b, two lense systems 40a, 40b, and potentially two substrates 42a, 42b. Interposed between the two pixel panels 38a, 38b and the substrates 42a, 42b is a beam splitter 152. The beam splitter 152 may be a simple piece of transparent material that allows a portion of light from each panel to either pass through, or to reflect.

In the present embodiment, the pixel panel 38a includes five DMDs and the pixel panel 38b includes four DMDs, each labeled with the reference numeral 160. To individually distinguish between each of the DMDs 160 in the attached drawings, a numeral "1", "2", "3", "4", "5", "6", "7", and "8" is written inside the DMDs. These numerals 1–8 are provided to simplify the discussion and support ray-tracing techniques between the DMDs and the substrate(s).

The DMDs 160 of the pixel panel 38a (with the numerals 1, 3, 5, 7, and 9) project their corresponding image through the lense section 40a and onto a first side 152a of the beam splitter 152. Likewise, the DMDs 160 of the pixel panel 38b (with the numerals 2, 4, 6, and 8) project their corresponding image through the lense section 40b and onto a second side 152b of the beam splitter 152.

For the sake of example, light from the DMDs 160 designated with the numerals 5 and 8 can be ray traced (hereinafter DMD #5 and DMD #8, respectively). A light ray 162 is projected from DMD #5 through the lense 40a and onto the surface 152a of the beam splitter 152. A portion of the light 162, designated 162b, passes straight through the beam splitter 152 and onto a site of the substrate 42b (the site designated with the numeral 5). A second portion of the light 162, designated 162a, reflects off of the beam splitter 152 and onto a site of the substrate 42a (also the site designated with the numeral 5). It is understood that the sum of the intensity of the light rays 162a and 162b should equal the intensity of the light ray 162.

Likewise, a light ray 164 is projected from DMD #8 through the lense 40b and onto the surface 152b of the beam splitter 152. A portion of the light 164, designated 164a, passes straight through the beam splitter 152 and onto a site of the substrate 42b (the site designated with the numeral 8). A second portion of the light 164, designated 164b, reflects off of the beam splitter 152 and onto a site of the substrate 42b (also the site designated with the numeral 8). As above, the sum of the intensity of the light rays 164a and 164b should equal the intensity of the light ray 164.

Figure 8:
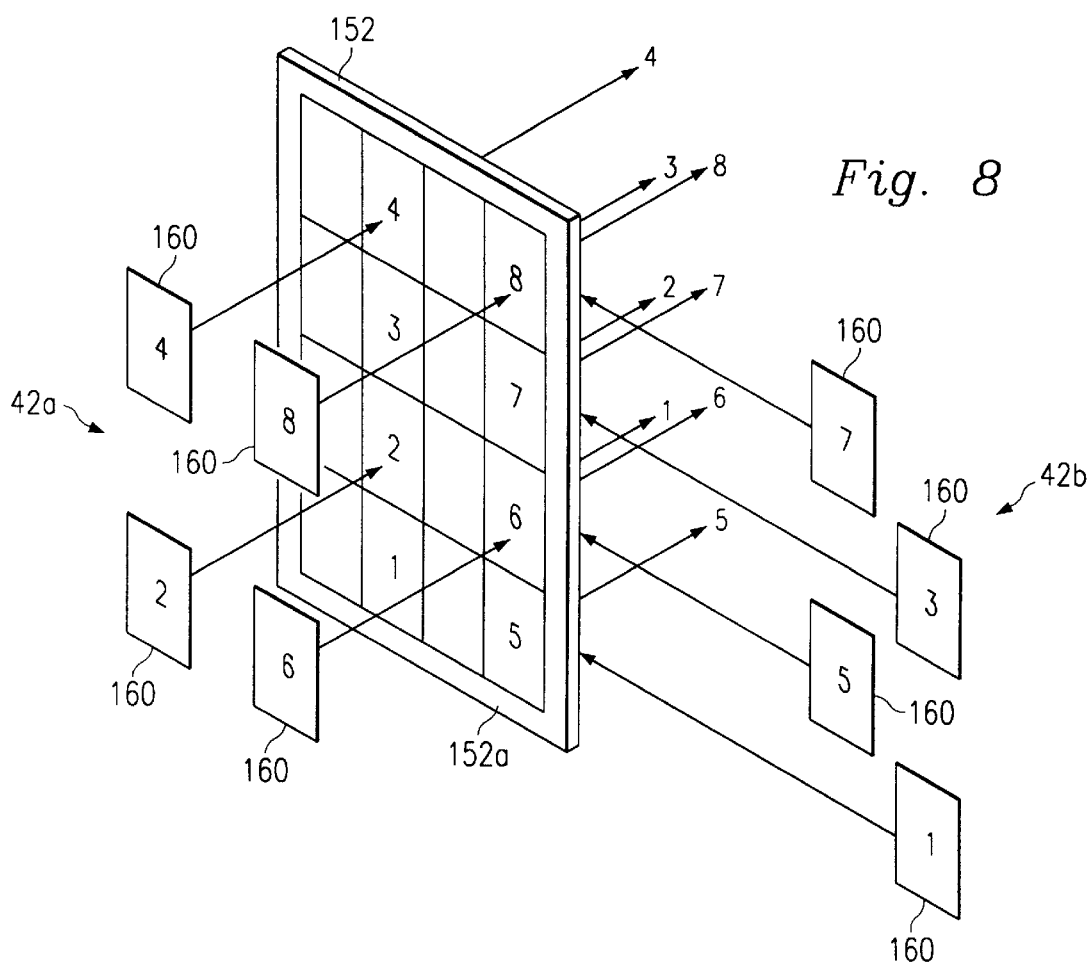
FIG. 8 is a side view of a beam splitter for implementing even more embodiments of the present invention.

As a result, multiple DMDs can be combined to form a single site 180a and/or 180b. The sites 180a, 180b may be relatively large and/or may have better resolution than the sites discussed in FIGS. 2–4b above. Referring also to FIG. 8, the DMDs can also be configured in different arrangements, such as illustrated, to accommodate the spacing requirements between adjacent DMDs.

Figure 9:
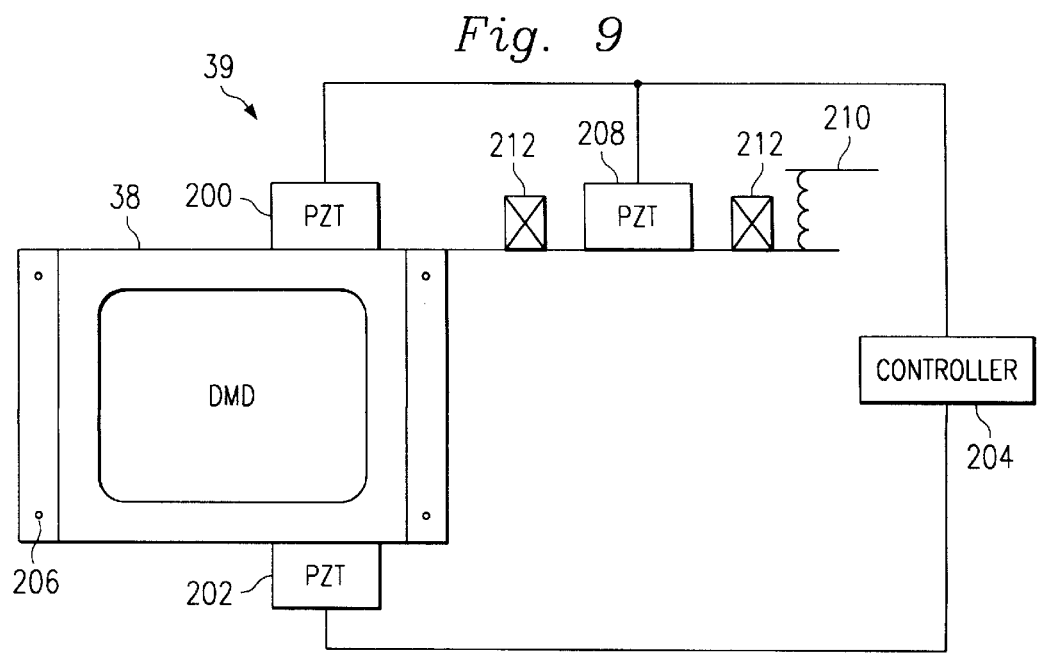
FIG. 9 is a diagram of several embodiments of a panel alignment stage for implementing features of the present invention.

Referring now to FIG. 9, in some embodiments, the pixel panel 38 of FIG. 1 is aligned with the panel alignment stage 39. In most cases, alignment of the pixel pattern can be accomplished by adjusting the individual coordinates of the pattern by the computer aided design system 36. This operation is more fully described in presently incorporated U.S. patent Ser. No. 09/480,796. However, it may be desirable to further align the pixel pattern using mechanical means.

In one embodiment, the panel alignment stage 39 includes two piezo electric mechanical devices (PZT) 200, 202. The PZTs 200, 202 are individually controlled by a controller 204 to provide mechanical alignment of the pixel panel 38. The pixel panel 38 (e.g., a DMD) is also loosely secured at a point 206 so that it can be moved or twisted in a desired way.

In another embodiment, instead of using the two PZTs 200, 202, only a single PZT 208 is used. The PZT 208 may be used in combination with other mechanical devices, such as a spring 210 and one or more coils 212, as well as the controller 204.

In operation, the pixel panel 38 can perform adjustments of the pixel pattern in one plane (e.g., the plane that is parallel with FIG. 9) and the panel alignment stage 39 can perform various adjustments outside of the plane. As a result, the sites formed by the pixel panel 38 are relatively in focus across the entire site.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A system for projecting a pixel-mask pattern onto a subject, the system comprising:
    a panel for generating a pattern comprising a plurality of pixel elements;
    a lense system for simultaneously directing each pixel element to a first site of the subject; and
    a manipulator for moving the pixel elements, relative to the subject, to a second site of the subject, such that a portion of the second site overlaps a portion of the first site and such that at least one of the pixel elements at the first site is not overlapped by any of the pixel elements at the second site.

2. The system of claim 1 further comprising:
    a light source for projecting light incident to the panel.

3. The system of claim 2 wherein the panel is a micro mirror array and the light selectively reflects off of the panel pixels to create the respective pixel element.

4. The system of claim 1 wherein the manipulator further moves the pixel elements, relative to the subject, to a third site of the subject, such that a portion of the third site overlaps a portion of the first site.

5. The system of claim 4 wherein the portion of the first site overlapped by the second site is the same as the portion of the first site overlapped by the third site.

6. The system of claim 1 wherein the first and second sites are pixel-sites created by a single pixel of the panel.

7. The system of claim 1 wherein the manipulator is a mechanical device for physically moving the panel, relative to the subject.

8. The system of claim 1 wherein the manipulator is an optical device for optically moving a light path for the pixel elements, relative to the subject.

9. The system of claim 1 wherein the manipulator is a rotating optical device for selectively moving a light path for the pixel elements, relative to the subject.

10. A system for projecting a pixel-mask pattern onto a subject, the system comprising:
    a panel for generating a pattern comprising a plurality of pixel elements;
    a lense system for simultaneously directing each pixel element to a first site of the subject; and
    a rotating prism for moving the pixel elements, relative to the subject, to a second site of the subject, such that a portion of the second site overlaps a portion to the first site,
    wherein the rotating prism includes a first portion for moving a light path for the pixel elements to a first offset, and a second portion for moving the light path for the pixel elements to a second offset.

11. The system of claim 1 wherein the manipulator includes two devices for moving a light path for the pixel elements in two dimensions, relative to the subject.
    an optical element for combining the pixel elements from the first portion of the panel with the pixel elements from the second portion of the panel so that both portions of pixel elements are directed to the substrate.

12. A system for projecting a pixel-mask pattern onto a subject, the system comprising:
    a panel for generating a pattern comprising a plurality of pixel elements, wherein the panel includes a first and second portion, each for creating a portion of the plurality of pixel elements;
    a lense system for simultaneously directing each pixel element to a first site of the subject;
    a manipulator for moving the pixel elements, relative to the subject, to a second site of the subject, such that a portion of the second site overlaps a portion of the first site; and
    an optical element for combining the pixel elements from the first portion of the panel with the pixel elements from the second portion of the panel so that both portions of pixel elements are directed to the substrate.

13. The system of claim 12 wherein the first and second portions of pixel elements are adjacently provided to the substrate.

14. The system of claim 12 wherein the first and second portions of pixel elements are overlappingly provided to the substrate.

15. A system for projecting a pixel-mask pattern onto a subject, the system comprising:
    a first panel for generating a first pattern comprising a first plurality of pixels for creating a first plurality of pixel elements, respectively;
    a second panel for generating a second pattern comprising a second plurality of pixels for creating a second plurality of pixel elements, respectively; and
    an optical element for combining the first and second elements so that they are simultaneously projected onto first and second adjacent sites of the subject, respectively.

16. The system of claim 15 further comprising:
    a first and second light source for projecting light incident to the first and second panels, respectively.

17. The system of claim 16 wherein the first and second panels are micro mirror arrays and the light selectively reflects off of the panel pixels to create the respective pixel elements.

18. The system of claim 15 further comprising:
    first and second lense systems for simultaneously directing each pixel element to the first site.

19. The system of claim 15 wherein the optical element also combines the first and second elements so that they are simultaneously projected onto a first site of a second subject.

20. The system of claim 19 wherein the optical element is a beam splitter.

21. The system of claim 15 further comprising:
    a manipulator for selectively moving the first and second pixel elements, relative to the subject, to third and fourth adjacent sites of the subject, respectively, such that a portion of the third and fourth sites overlap a portion of the first and second sites.

22. The system of claim 21 wherein the manipulator is an optical device for optically moving a light path for the pixel elements, relative to the subject.

23. The system of claim 21 wherein the manipulator is a rotating optical device for selectively moving a light path for the pixel elements, relative to the subject.

24. The system of claim 21 wherein the manipulator is a rotating prism with a first portion for moving a light path for the pixel elements to a first offset, and a second portion for moving the light path for the pixel elements to a second offset.

25. The system of claim 1 wherein at least one of the pixel elements at the first site is completely overlapped by one of the pixel elements at the second site.

* * * * *